(12) United States Patent
Kim et al.

(10) Patent No.: US 11,258,228 B2
(45) Date of Patent: Feb. 22, 2022

(54) OPTICAL COMMUNICATION MODULE

(71) Applicant: OPTICIS CO., LTD., Seongnam-si (KR)

(72) Inventors: Hee Dae Kim, Gwangju (KR); Jeong Beom Yoon, Gwangju (KR)

(73) Assignee: OPTICIS CO., LTD., Gyeonggi-do (KR)

( * ) Notice: Subject to any disclaimer, the term of this patent is extended or adjusted under 35 U.S.C. 154(b) by 72 days.

(21) Appl. No.: 16/837,267

(22) Filed: Apr. 1, 2020

(65) Prior Publication Data

US 2020/0335936 A1      Oct. 22, 2020

(30) Foreign Application Priority Data

Apr. 16, 2019  (KR) .......................... 10-2019-0044472

(51) Int. Cl.
*H01S 5/024* (2006.01)
*G02B 6/42* (2006.01)
*H01S 5/022* (2021.01)

(52) U.S. Cl.
CPC ........ *H01S 5/02415* (2013.01); *G02B 6/4206* (2013.01); *G02B 6/4236* (2013.01);
(Continued)

(58) Field of Classification Search
CPC ... G02B 6/4236; H01S 5/02407; H01S 5/022; H01S 5/024; H01S 5/02438; H01S 5/02423
(Continued)

(56) References Cited

U.S. PATENT DOCUMENTS 4,884,279 A   11/1989   Odagiri
5,602,860 A    2/1997   Masonson
(Continued)

FOREIGN PATENT DOCUMENTS

JP    S63-265480    11/1988
JP    H11-126939     5/1999
(Continued)

OTHER PUBLICATIONS

Japanese Office Action (Application No. 2020-071924) dated May 7, 2021.
(Continued)

*Primary Examiner* — Tuan N Nguyen
(74) *Attorney, Agent, or Firm* — Nixon Peabody LLP; Jeffrey L. Costellia (57) ABSTRACT

Provided is an optical communication module. The optical communication module includes: an optical device configured to provide an optical output from an electrical input; a circuit board on which the optical device is mounted and which is configured to provide the electrical input to the optical device; a temperature compensation element mounted on a side of the circuit board; and a mechanical switch connected to the temperature compensation element and configured to turn on/off according to ambient temperature for supplying or interrupting power to the temperature compensation element. The optical communication module includes the temperature compensation element configured to heat or cool the optical device according to ambient temperature, thereby maintaining proper modulation performance and optical power over a wide range of temperature in low-temperature and high-temperature environments.

16 Claims, 6 Drawing Sheets

(52) U.S. Cl.
CPC ............ *G02B 6/4266* (2013.01); *H01S 5/022* (2013.01); *H01S 5/02438* (2013.01)

(58) Field of Classification Search
USPC .......................................................... 372/34
See application file for complete search history.

(56) References Cited

U.S. PATENT DOCUMENTS

| | | | |
|---|---|---|---|
| 8,320,763 | B2 | 11/2012 | Kim et al. |
| 2003/0076565 | A1* | 4/2003 | Noda ..................... H01S 5/024 398/164 |
| 2009/0296761 | A1* | 12/2009 | Hakomori ............ G02B 6/4246 372/34 |
| 2012/0139419 | A1 | 6/2012 | Tamanuki |
| 2017/0261712 | A1* | 9/2017 | Ghandour ............. G01J 1/0252 |

FOREIGN PATENT DOCUMENTS

| | | |
|---|---|---|
| JP | 2002-134833 | 5/2002 |
| JP | 2004-221409 | 8/2004 |
| KR | 10-2009-0106382 | 10/2009 |
| KR | 10-2012-0017875 | 2/2012 |

OTHER PUBLICATIONS

Korean Office Action for 10-2019-0044472 dated Jan. 18, 2020.
European Search Report (Application No. 20167667.3) dated Sep. 10, 2020.

* cited by examiner

OPTICAL COMMUNICATION MODULE

CROSS-REFERENCE TO RELATED APPLICATION

This application claims the benefit of Korean Patent Application No. 10-2019-0044472, filed on Apr. 16, 2019, in the Korean Intellectual Property Office, the disclosure of which is incorporated herein in its entirety by reference.

BACKGROUND

1. Field

One or more exemplary embodiments relate to an optical communication module.

2. Description of the Related Art

Optical communication modules may be used to transmit digital visual interface (DVI) signals or high definition multimedia interface (HDMI) signals and may have a structure in which a plurality of optical devices and a plurality of optical fibers are optically aligned with each other to provide a plurality of communication channels.

Although such optical communication modules include optical devices to provide an optical output from an electrical input, due to the temperature-dependent output characteristics of optical devices, optical devices may not provide an optical output proportional to an electrical input or may not provide sufficient optical output power at certain temperatures in a low-temperature environment or a high-temperature environment.

SUMMARY

One or more embodiments include an optical communication module including a temperature compensation element configured to heat or cool an optical device according to ambient temperature for maintaining proper modulation performance and optical power over a wide range of temperature in low-temperature and high-temperature environments.

According to one or more embodiments, an optical communication module includes:
an optical device configured to provide an optical output from an electrical input;
a circuit board on which the optical device is mounted and which is configured to provide the electrical input to the optical device;
a temperature compensation element mounted on a side of the circuit board; and
a mechanical switch connected to the temperature compensation element and configured to turn on/off according to ambient temperature for supplying or interrupting power to the temperature compensation element.

For example, the mechanical switch may be configured to turn on and off without driving power.

For example, the mechanical switch may include a bi-metal including different types of metal plates which are bonded together and have different thermal expansion coefficients.

For example, the optical device and the temperature compensation element may be mounted on opposite surfaces of the circuit board.

For example, the optical device and the temperature compensation element may be arranged such that at least portions of the optical device and the temperature compensation element may overlap each other.

For example, the temperature compensation element may include at least one of a heating element configured to heat the optical device and a heat absorbing element configured to cool the optical device.

For example, the temperature compensation element may include:
a heating element configured to generate heat at a low temperature; and
a heat absorbing element configured to absorb heat at a high temperature,
wherein the mechanical switch may include:
a heating switch connected to the heating element and configured to supply or interrupt power to the heating element while turning on/off according to ambient temperature; and
a cooling switch connected to the heat absorbing element and configured to supply or interrupt power to the heat absorbing element while turning on/off according to ambient temperature.

For example, the temperature compensation element may include a heating element for heating, and
when the optical device has a temperature range of $\Delta T1$ as a properly operable range ranging from a first temperature to a second temperature,
the mechanical switch may be configured to turn on at the first temperature or lower, and
the temperature compensation element may be configured to increase a temperature of the optical device to a value different from ambient temperature by a temperature difference $\Delta T2$ which is less than the $\Delta T1$.

For example, when the optical device has a temperature range of about 0° C. to about 60° C. as the properly operable range,
the mechanical switch may be configured to turn on at about 0° C. or lower, and
the temperature compensation element may be configured to increase the temperature of the optical device to a value different from ambient temperature by about 50° C.

For example, the $\Delta T1$ may be about 60° C., and the $\Delta T2$ may be about 50° C.

For example, the temperature compensation element may include a heat absorbing element for cooling, and
when the optical device has a temperature range of $\Delta T1$ as a properly operable range ranging from a first temperature to a second temperature,
the mechanical switch may be configured to turn on at the second temperature or higher, and
the temperature compensation element may be configured to decrease a temperature of the optical device to a value different from ambient temperature by a temperature difference $\Delta T2$ which is less than the $\Delta T1$.

For example, when the optical device has a temperature range of about 0° C. to about 60° C. as the properly operable range,
the mechanical switch may be configured to turn on at about 60° C. or higher, and
the temperature compensation element may be configured to decrease the temperature of the optical device to a value different from ambient temperature by about 50° C.

For example, the $\Delta T1$ may be about 60° C., and the $\Delta T2$ may be about 50° C.

For example, the temperature compensation element may include a thermoelectric element including a first surface facing the optical device and a second surface opposite the first surface, one of the first and second surfaces functioning as a heating surface having a relatively high temperature, the other of the first and second surfaces functioning as a heat absorbing surface having a relatively low temperature, wherein the mechanical switch may include:

a heating switch connected to the thermoelectric element and configured to supply or interrupt power while turning on/off such that the first surface of the thermoelectric element may function as the heating surface; and a cooling switch connected to the thermoelectric element and configured to supply or interrupt power while turning on/off such that the first surface of the thermoelectric element may function as the heat absorbing surface.

For example, the heating switch and the cooling switch may be configured to supply driving current to the thermoelectric element in opposite directions.

For example, the optical device, the circuit board, the temperature compensation element, and the mechanical switch may be accommodated in a module housing.

For example, a stationary air layer contained in a module housing may be between the optical device and the mechanical switch.

For example, a resin molding surrounding the optical device may be between the optical device and the mechanical switch.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Optical communication modules will now be described according to embodiments with reference to the accompanying drawings.

Figure 1:
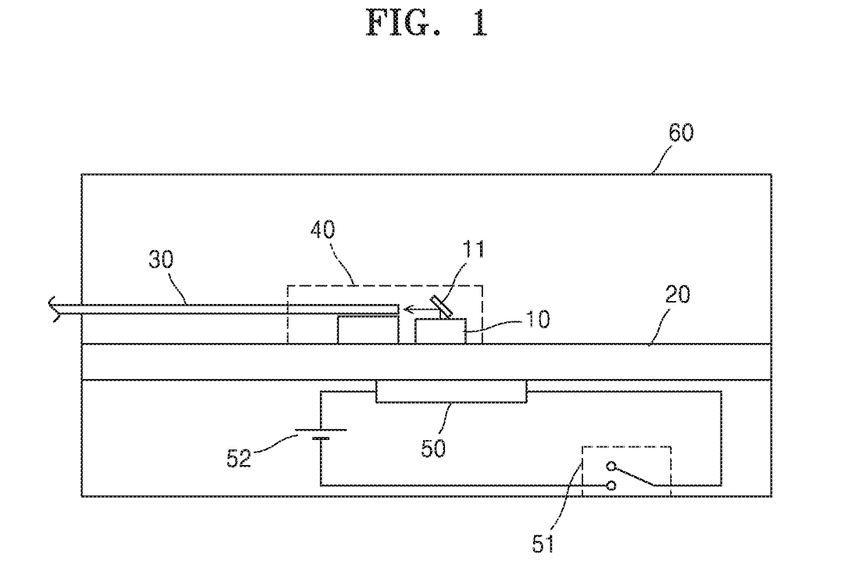
FIG. 1 is a view illustrating an optical communication module according to an embodiment.

FIG. 1 is a view illustrating an optical communication module according to an embodiment. Referring to FIG. 1, the optical communication module may include: an optical device 10 configured to output an optical signal in response to an electrical drive signal; a circuit board 20 on which the optical device 10 is mounted and which is configured to apply drive signals to the optical device 10; and an optical fiber 30 having an end portion to which an optical signal output from the optical device 10 is input. In the embodiment, a temperature compensation element 50 may be arranged on the circuit board 20 on which the optical device 10 is mounted. For example, the optical device 10 and the temperature compensation element 50 may be mounted on opposite surfaces of the circuit board 20. For example, the device 10 and the temperature compensation element 50 may be mounted at overlapping positions with the circuit board 20 therebetween to facilitate thermal flow between the optical device 10 and the temperature compensation element 50.

The optical communication module may include a module housing 60 to protect internal elements from an external environment and seal the inside of the optical communication module. In addition, the optical communication module may include an opening for outputting optical signals of the optical device 10 and a reflection mirror 11 for optically aligning the end portion of the optical fiber 30.

Figure 2:
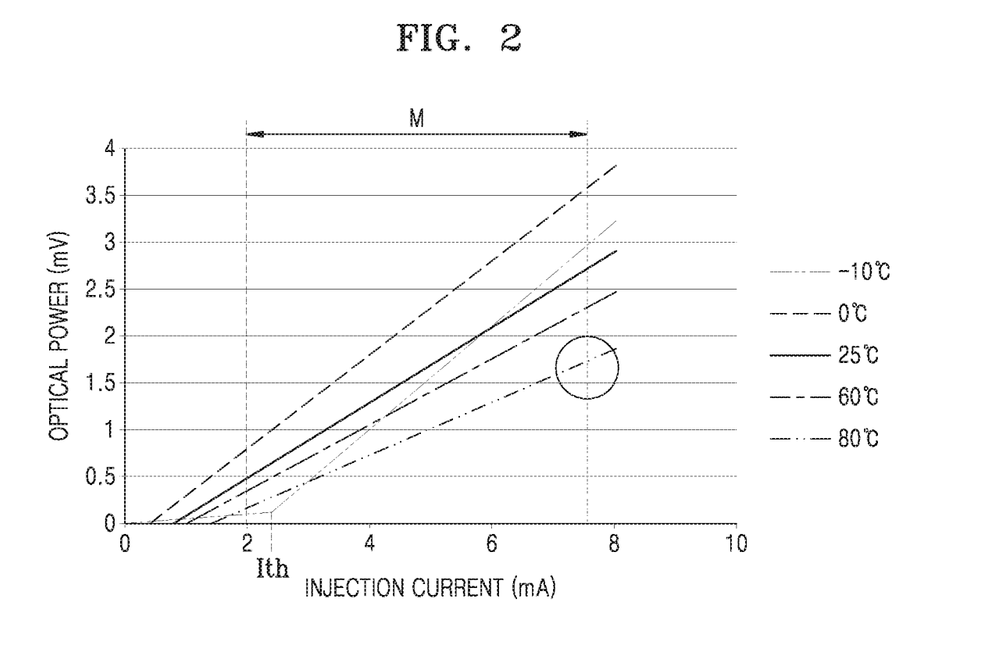
FIG. 2 is a graph illustrating the optical power of an optical device with respect to injection current at different temperatures when a temperature compensation element is not operated and a vertical cavity surface emitting laser (VCSEL) is used as the optical device.

FIG. 2 is a view illustrating the optical power of the optical device 10 with respect to injection current at different temperatures when the temperature compensation element 50 is not operated and a vertical cavity surface emitting laser (VCSEL) is used as the optical device 10. In FIG. 2, a modulation section M may refer to a section in which modulation is performed to convert the high/low levels of injection current into the high/low levels of optical power for converting an electrical input signal (corresponding to the injection current) into an optical output signal (corresponding to the optical power). The modulation section M may be set to be away from at least a threshold current Ith. Here, when injection current is less than the threshold current Ith, output power does not practically vary with the injection current (optical power is substantially zero), and thus the modulation section M for modulation between injection current and optical power may be set to be away from the threshold current Ith.

Referring to FIG. 2, since the modulation section M is away the threshold current Ith when the temperature of the optical device 10 is 0° C. or higher, the temperature of the optical device 10 may be maintained to be 0° C. or higher. When the temperature of the optical device 10 is less than 0° C., the threshold current Ith is within the modulation section M, for example, when the temperature of the optical device 10 is −10° C., the threshold current Ith is about 2.5 mA which is within the modulation section M. Thus, the temperature of the optical device 10 may be maintained to be about 0° C. or higher to place the threshold current Ith away from the modulation section M.

In addition, when the temperature of the optical device 10 is greater than about 60° C., the optical power of the optical device 10 decreases, and thus during modulation in which an optical output (corresponding to optical power) is converted into low/high levels according to the low/high levels of an electrical input (corresponding to injection current), the optical power difference between low/high levels may not be sufficiently large, such that noise components and signal components may not be clearly distinguished. In addition, a receiving end may have difficulty in extracting signal components by removing nose components. Thus, a temperature range guaranteeing a proper operation of the optical device 10 may be set to be from 0° to 60° C.

In an embodiment, the temperature compensation element 50 may operate according to ambient temperature, and in this case, temperatures corresponding to the lower limit (for example, 0° C.) and the upper limit (for example, 60° C.) of the temperature range guaranteeing a proper operation of the optical device 10 may be set as a lower threshold temperature and a upper threshold temperature for initiating the operation of the temperature compensation element 50 such that an intended optical output (corresponding to optical power) may be obtained from an electrical input (corresponding to injection current) substantially at any temperature by the modulation of the optical device 10.

For example, the lower threshold temperature of the temperature compensation element 50 may be set to be 0° C., and thus when ambient temperature is about 0° C. or less, the temperature compensation element 50 may be turned on to heat the optical device 10 to an intended temperature range (for example, 0° C. or higher). As described later, as the temperature compensation element 50 is operated, the temperature of the optical device 10 may be increased to have a difference from ambient temperature by about 50° C. Therefore, even when ambient temperature decreases to about 0° C. or less, the temperature of the optical device 10 may increase to a temperature of about 50° C. or less as the temperature compensation element 50 is turned on.

In addition, the upper threshold temperature of the temperature compensation element 50 may be set to be 60° C., and thus when ambient temperature is about 60° C. or higher, the temperature compensation element 50 may be turned on to cool the optical device 10 to an intended temperature range (for example, about 60° C. or less). As described later, as the temperature compensation element 50 is operated, the temperature of the optical device 10 may be decreased to have a difference from ambient temperature by about 50° C. Therefore, even when ambient temperature increases to about 60° C. or higher, the temperature of the optical device 10 may decrease to a temperature of about 10° C. or higher as the temperature compensation element 50 is turned on. The mechanism, in which the temperature of the optical device 10 is increased or decreased to have a constant difference from ambient temperature by the operation of the temperature compensation element 50, will be described later.

Figure 3:
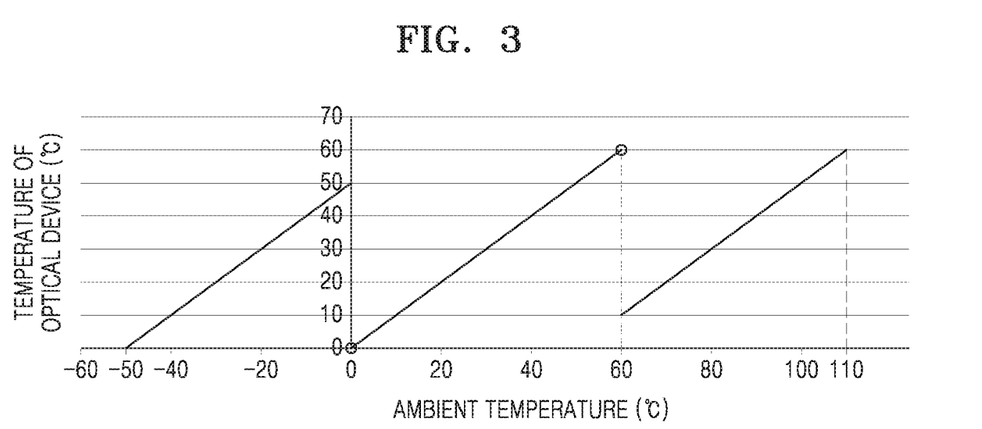
FIG. 3 is a graph illustrating the temperature of the optical device with respect to ambient temperature in a state in which the temperature compensation element is operated.

FIG. 3 is a graph showing the temperature of the optical device 10 with respect to ambient temperature in a state in which the temperature compensation element 50 is operated. Here, as described later, ambient temperature may refer to the temperature of a position at which a mechanical switch 51 configured to turn on and off to supply and interrupt power to the temperature compensation element 50 according to ambient temperature is arranged. The temperature of the optical device 10 may vary as the optical device 10 is heated or cooled by the temperature compensation element 50 according to the difference between the temperature of the optical device 10 and ambient temperature, and ambient temperature may refer to an external temperature which is constant independent of the operation of the temperature compensation element 50. For example, the external temperature may refer to the temperature of an external environment surrounding the optical communication module.

The temperature of the optical device 10 may refer to a temperature which is directly affected by the operation of the temperature compensation element 50 and directly affects the modulation or optical power of the optical device 10. The temperature compensation element 50 may be in contact with the optical device 10 with the circuit board 20 therebetween, such that the heating and cooling of the temperature compensation element 50 may directly affect the temperature of the optical device 10. For example, since the optical device 10 is in contact with the temperature compensation element 50 through the circuit board 20, the optical device 10 and the temperature compensation element 50 may be quickly thermally balanced with each other through heat transfer occurring by conduction.

Referring to FIG. 3, when ambient temperature is higher than about 0° C., the temperature compensation element 50 is not operated, and when ambient temperature is 0° C. or less, the temperature compensation element 50 is operated such that the temperature of the optical device 10 may be increased to have a constant difference of, for example, about 50° C. from ambient temperature. For example, when ambient temperature is 0° C., the temperature of the optical device 10 may be increased to 50° C. as being heated by the temperature compensation element 50.

In addition, when ambient temperature is lower than about 60° C., the temperature compensation element 50 is not operated, and when ambient temperature is about 60° C. or higher, the temperature compensation element 50 is operated such that the temperature of the optical device 10 may be decreased to have a constant difference of, for example, about 50° C. from ambient temperature. For example, when ambient temperature is about 60° C., the temperature of the optical device 10 may be decreased to about 10° C. as being cooled by the temperature compensation element 50.

When the temperature compensation element 50 is not operated, the ambient temperature range in which the optical device 10 properly operates may be limited to a narrow range of about 0° C. to about 60° C., but when the temperature compensation element 50 is operated, the ambient temperature range in which the optical device 10 properly operates may be extended to a wide range of about −50° C. to about 110° C. That is, owing to the use of the temperature compensation element 50, it may be possible to maintain proper modulation performance within a widened temperature range during modulation for converting an electrical signal (corresponding to injection current) into an optical signal (corresponding to optical power).

The temperature compensation element 50 may maintain the temperature of the optical device 10 within a proper range even in a low temperature environment or high temperature environment by heating or cooling the optical device 10. That is, the temperature compensation element 50 may include a heating element for heating the optical device 10 or a heat absorbing element for cooling the optical device 10. In some embodiments, the temperature compensation element 50 may include at least one of a heating element and a heat absorbing element, and in various other embodiments, the temperature compensation element 50 may include only a heating element and may not include a heat absorbing element, or may include only a heat absorbing element and may not include a heating element, or may include both a heating element and a heat absorbing element. For example, according to an ambient temperature condition in which the optical communication module is placed, the temperature compensation element 50 included in the optical communication module may optionally include only one of a heating element and a heat absorbing element or may include both a heating element and a heat absorbing element.

Referring to FIG. 1, the temperature compensation element 50 may include a thermoelectric element that heats or cools the optical device 10 by using an electrical power source 52 as a power input. In this case, the temperature compensation element 50 may be connected to the mechanical switch 51 configured to supply or interrupt power to the temperature compensation element 50 according to ambient temperature, and the temperature compensation element 50 and the power source 52 may be connected to each other through the mechanical switch 51.

The temperature compensation element 50 is started to operate by the mechanical switch 51 that senses ambient temperature, and once the temperature compensation element 50 is started to operate, the temperature compensation element 50 may apply a constant amount of heat (heating) or remove a constant amount of heat (cooling) independent of ambient temperature. Here, the constant amount of heat may refer to a heat amount corresponding to the amount of heat loss caused by a constant temperature difference between the temperature of the optical device 10 and ambient temperature. For example, when the temperature compensation element 50 supplies an amount of heat corresponding to constant heat loss caused by a constant temperature difference, for example, a temperature difference of about 50° C. between the temperature of the optical device 10 and ambient temperature in a steady state, the constant temperature difference between the optical device 10 and ambient temperature may be maintained, and thus the temperature of the optical device 10 may be maintained to have a constant temperature difference from ambient temperature. For reference, the term "amount of heat" may refer to a thermal flow which occurs between two objects per unit time and is determined not by the specific temperatures of the two objects but by the temperature difference between the two objects. Therefore, the heat loss caused by a constant temperature difference between the temperature of the optical device 10 and ambient temperature may be constant, and in a steady state, the constant temperature difference between the temperature of the optical device 10 and ambient temperature may be maintained by supplying, from the temperature compensation element 50, an amount of heat corresponding to the constant heat loss.

In an embodiment, the temperature compensation element 50 may be started to operate by the mechanical switch 51 that turns on and off according to ambient temperature. Here, unlike electrical switches, the mechanical switch 51 does not require a driving power source for switching between ON and OFF states. For example, unlike the mechanical switch 51 of the embodiment, electrical switches, such as a bipolar junction transistor (BJT), a junction field effect transistor (JFET), or a metal-oxide-semiconductor field-effect transistor (MOSFET), require a driving power source for switching between ON and OFF states. For example, such an electrical switch needs to form an electric field to form a channel for carriers such as holes or electrons, and thus requires a driving power source for the operation of the electrical switch itself.

Unlike such electrical switches, the mechanical switch 51 of the present embodiment does not require a power source for the operation of the mechanical switch 51 itself. That is, in embodiments, the temperature compensation element 50 requires the power source 52 for heating and cooling the optical device 10, but the mechanical switch 51 used to start the operation of the temperature compensation element 50 does not require a separate driving power source for switching between ON and OFF states. For example, in an embodiment, the mechanical switch 51 may be a temperature-sensitive switch configured to respond to ambient temperature and switch between ON and OFF states according to the ambient temperature without requiring a separate electrical power source.

For example, a bi-metal switch in which different types of metal plates having different thermal expansion coefficients are bonded together may be used as the mechanical switch 51. The on-off switching of the bi-metal switch may occur when the different types of metal plates bend in one direction due to different amounts of thermal expansion according to ambient temperature, and thus the bi-metal switch is not required to be electrically powered for on-off switching.

For example, when the different types of metal plates having different thermal expansion coefficients with respect to temperature are bent in a direction of a metal plate having a relatively large or small thermal expansion coefficient in response to ambient temperature, the bi-metal switch may turn on to supply power, and when the different types of metal plates having different thermal expansion coefficients with respect to temperature are returned to an original state in response to ambient temperature, the bi-metal switch may turn off to interrupt power.

In an embodiment, the lower threshold temperature and the upper threshold temperature at which the mechanical switch 51 starts to operate is may be set to 0° C. and 60° C., respectively. That is, when ambient temperature is about 0° C. or lower or about 60° C. or higher, the mechanical switch 51 may turn on to supply power to the temperature compensation element 50 and initiate the operation of the temperature compensation element 50. Furthermore, when ambient temperature falls within a proper range outside a low temperature environment or high temperature environment in an ON state in which power is being supplied to the temperature compensation element 50, the mechanical switch 51 turns off to interrupt power to the temperature compensation element 50 and thus to stop the operation of the temperature compensation element 50.

The mechanical switch 51 may sense ambient temperature, not the temperature of the optical device 10, and may turn on or off in response to ambient temperature. This will now be described. That is, in a low temperature environment in which ambient temperature is lower than the lower threshold temperature, the mechanical switch 51 may turn on, and as the operation of the temperature compensation element 50 is started by the turning-on of the mechanical switch 51, the temperature of the optical device 10 may be increased to have a constant difference from ambient temperature. In this case, since ambient temperature does not vary even when the temperature compensation element 50 is operated, the mechanical switch 51 does not turn off and stays in the ON state even though the temperature of the optical device 10 is increased as a result of the operation of the temperature compensation element 50. In this state, the temperature compensation element 50 may supply a constant amount of heat to the optical device 10, and the temperature of the optical device 10 may increase until the amount of heat supplied to the optical device 10 and the amount of heat dissipating from the optical device 10 are balanced to reach a steady state, that is, until the temperature of the optical device 10 increases and then has a constant difference from ambient temperature. The expression "the temperature of the optical device 10 and ambient temperature have a constant difference from each other" may indicate that the amount of heat dissipating from the optical device 10 to the outside is constant. The temperature compensation element 50 may supply heat to the optical device 10 in an amount corresponding to the amount of heat loss occurring when the temperature of the optical device 10 and ambient temperature have a difference of about 50° C., thereby maintaining the difference between the temperature of the optical device 10 and ambient temperature at a constant level. In this case, since the optical device 10 is supplied with an amount of heat, which corresponds to the amount of heat loss caused by the temperature difference of about 50° C. from ambient temperature, from the temperature compensation element 50, the amount of heat loss from the optical device 10 and the amount of heat supplied to the optical device 10 may be maintained at constant levels with time, thereby reaching a constant temperature steady state. That is, in an embodiment, a constant amount of heat is supplied to the optical device 10 such that the temperature of the optical device 10 may be increased to have a constant difference from ambient temperature.

For reference, the term "amount of heat" may refer to a thermal flow which occurs between two objects per unit time and is determined not by the specific temperatures of the two objects but by the temperature difference between the two objects. Therefore, the heat loss caused by a constant temperature difference between the temperature of the optical device 10 and ambient temperature may be constant, and in a steady state, the constant temperature difference between the temperature of the optical device 10 and ambient temperature may be maintained by supplying, from the temperature compensation element 50, an amount of heat corresponding to the heat loss.

As described above, the mechanical switch 51 turns on and off according to ambient temperature but does not turn on and off according to the operation of the temperature compensation element 50 or the temperature of the optical device 10. Unlike in embodiments, when the mechanical switch 51 is configured to turn on and off according to the temperature of the optical device 10, since the mechanical switch 51 is directly affected by the operation of the temperature compensation element 50 or the temperature of the optical device 10, the mechanical switch 51 may be repeatedly rapidly turned on and off for a short period of time, adversely affecting the durability or reliability of the optical communication module. For example, when the mechanical switch 51 turns on according to the temperature of the optical device 10, the temperature compensation element 50 is started to operate, and then the mechanical switch 51 turns off immediately after the temperature of the optical device 10 is varied to a proper vale by the operation of the temperature compensation element 50. Then, the mechanical switch 51 immediately turns on again as the temperature of the optical device 10 approaches the low/upper threshold temperature while the temperature compensation element 50 is not operated. In this manner, the mechanical switch 51 may repeatedly turn on and off for a short period of time, and thus the operation of the temperature compensation element 50 may be repeatedly started and stopped for a short period of time. That is, due to the mechanism in which the operation of the temperature compensation element 50 is determined by the on-off switching of the mechanical switch 51 and the on-off switching of the mechanical switch 51 is determined by the heating or cooling operation of the temperature compensation element 50, the on-off switching of the mechanical switch and the resulting starting/stopping of the operation of the temperature compensation element 50 may be frequently repeated in an environment near a threshold temperature, for example, near a lower threshold temperature of 0° C. or an upper threshold temperature of 60° C., and thus the durability or reliability of the optical communication module may decrease.

In an embodiment, since the mechanical switch 51 is operated depending on ambient temperature, the on-off switching of the mechanical switch 51 is not affected by the operation of the temperature compensation element 50, and a steady state is induced in which the amount of heat supplied to the optical device 10 from the temperature compensation element 50 is balanced with the amount of heat loss caused by the difference between the temperature of the optical device 10 and ambient temperature, such that the temperature of the optical device 10 may be maintained to have a constant difference from ambient temperature.

As described above, ambient temperature determining the on-off switching of the mechanical switch 51 is different from the temperature of the optical device 10, and the mechanical switch 51 may be positioned away from the optical device 10 and may be thermally insulated such that ambient temperature and the temperature of the optical device 10 may not be affected by each other.

For example, the module housing 60 may accommodate a stationary air layer of which the flow rate is substantially zero, and thus the optical device 10 and the mechanical switch 51 may be insulated from each other by the stationary air layer. For example, the optical device 10 may be in contact with the temperature compensation element 50 with the circuit board 20 therebetween and thus may rapidly reach thermal equilibrium with the temperature compensation element 50 by thermal conduction. However, since the mechanical switch 51 is mounted on an inner wall of the module housing 60 away from the circuit board 20 and is surrounded by the stationary air layer, the mechanical switch 51 may not be affected by the temperature compensation element 50. As described above, the optical device 10 is capable of rapidly reaching thermal equilibrium with the temperature compensation element 50, and the mechanical switch 51 is insulated so as not to be affected by the temperature compensation element 50, such that the temperature of the optical device 10 and the temperature (ambient temperature) of the mechanical switch 51 may be different from each other. Here, the module housing 60 may provide thermal insulation between the optical device 10 and the mechanical switch 51 because the module housing 60 accommodate a stationary air layer of which the flow rate is substantially zero. To this end, an inlet or an outlet for fluidly connecting the inside and the outside of the module housing 60 to each other may not be formed in the module housing 60, and the inside of the module housing 60 may be sealed from the outside of the module housing 60.

Referring to FIG. 1, a solid insulator such as a resin molding 40 may be arranged between the optical device 10 and the mechanical switch 51, and for example, the optical device 10 and the mechanical switch 51 may be insulated from each other by the resin molding 40 covering the periphery of the optical device 10. In this case, since the resin molding 40 and the stationary air layer are between the optical device 10 and the mechanical switch 51, the optical device 10 and the mechanical switch 51 may be thermally insulated from each other. Here, the expression "the resin molding 40 is arranged between the optical device 10 and the mechanical switch 51" may indicate that the resin molding 40 is arranged on a heat dissipation path of the optical device 10. In various embodiments, the mechanical switch 51 may be placed on the inner wall of the module housing 60 at a position facing the resin molding 40, and the optical device 10 may dissipate heat through the resin molding 40 surrounding the optical device 10.

In the embodiment shown in FIG. 1, the mechanical switch 51 is mounted on the inner wall of the module housing 60 at a position opposite the optical device 10 with respect to the circuit board 20. However, the technical scope of the present disclosure is not limited thereto, and in other embodiments, the mechanical switch 51 may be placed on the same side as the optical device 10 with respect to the circuit board 20. In these arrangements, the stationary air layer contained in the module housing 60 and the resin molding 40 surrounding the optical device 10 are arranged between the optical device 10 and the mechanical switch 51, thereby thermally insulating the optical device 10 and the mechanical switch 51 from each other and preventing the temperature of the optical device 10 and the temperature of the mechanical switch 51, that is, ambient temperature, from affecting each other.

The mechanical switch 51 mounted on the inner wall of the module housing 60 may be in contact with the outside with the module housing 60 therebetween and may thus exchange heat with the outside by conduction for thermal equilibrium with the outside having ambient temperature, and thus the temperature of the periphery of the mechanical switch 51 may substantially correspond to the temperature of the outside of the module housing 60. In other embodiments, the mechanical switch 51 may be placed outside the module housing 60. The mechanical switch 51 placed outside the module housing 60 may determine, based on ambient temperature, whether to initiate the operation of the temperature compensation element 50.

In an embodiment, the temperature compensation element 50 may operate as a heating element for heating, and when the temperature range in which the optical device 10 properly operates is from about 0° C. to about 60° C., the mechanical switch 51 may turn on at a temperature of about 0° C. or less. In this case, as the temperature compensation element 50 is operated, the temperature of the optical device 10 may be increased to be higher than ambient temperature by about 50° C.

When the temperature of the optical device 10 is increased to be higher than ambient temperature by about 70° C. by the operation of the temperature compensation element 50, the optical device 10 may not be properly operated in case in which the ambient temperature is about 0° C. because the temperature of the optical device 10 rises to about 70° C. (which is higher than the upper threshold temperature of 60° C. for a proper operation of the optical device 10). That is, when the temperature range in which the optical device 10 properly operates is from about 0° C. to about 60° C., the temperature compensation element 50 may increase the temperature of the optical device 10 to a value different from ambient temperature by less than about 60° C., for example, by about 50° C.

In other words, when the optical device 10 has a properly operable temperature range of ΔT1 (for example, a temperature range of about 60° C.) between a first temperature (for example, about 0° C.) and a second temperature (for example, 60° C.), the mechanical switch 51 may turn on at the first temperature (for example, about 0° C.) or lower, and the temperature compensation element 50 may increase the temperature of the optical device 10 to a value higher than ambient temperature by ΔT2 (for example, about 50° C.) which is less than ΔT1 (for example, about 60° C.).

In an embodiment, the temperature compensation element 50 may operate as a heat absorbing element for cooling, and when the temperature range in which the optical device 10 properly operates is from about 0° C. to about 60° C., the mechanical switch 51 may turn on at a temperature of about 60° C. or higher. In this case, as the temperature compensation element 50 is operated, the temperature of the optical device 10 may be decreased to be lower than ambient temperature by about 50° C.

When the temperature of the optical device 10 is decreased to be lower than ambient temperature by about 70° C. by the operation of the temperature compensation element 50, the optical device 10 may not be properly operated in case in which the ambient temperature is about 60° C. because the temperature of the optical device 10 decreases to about −10° C. (which is lower than the lower threshold temperature of 0° C. for a proper operation of the optical device 10). That is, when the temperature range in which the optical device 10 properly operates is from about 0° C. to about 60° C., the temperature compensation element 50 may decrease the temperature of the optical device 10 to a value different from ambient temperature by less than 60° C., for example, by about 50° C.

In other words, when the optical device 10 has a properly operable temperature range of ΔT1 (for example, a temperature range of about 60° C.) between a first temperature (for example, about 0° C.) and a second temperature (for example, about 60° C.), the mechanical switch 51 may turn on at the second temperature (for example, about 60° C.) or higher, and the temperature compensation element 50 may decrease the temperature of the optical device 10 to a value lower than ambient temperature by ΔT2 (for example, about 50° C.) which is less than ΔT1 (for example, about 60° C.).

Figure 4:
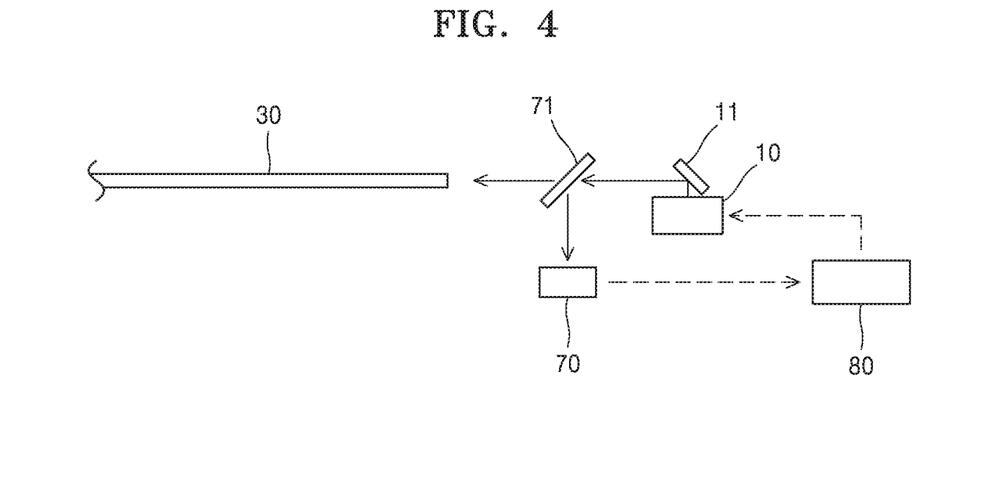
FIGS. 4 to 6 are views illustrating optical communication modules according to comparative examples for comparison with embodiments.
Figure 5:
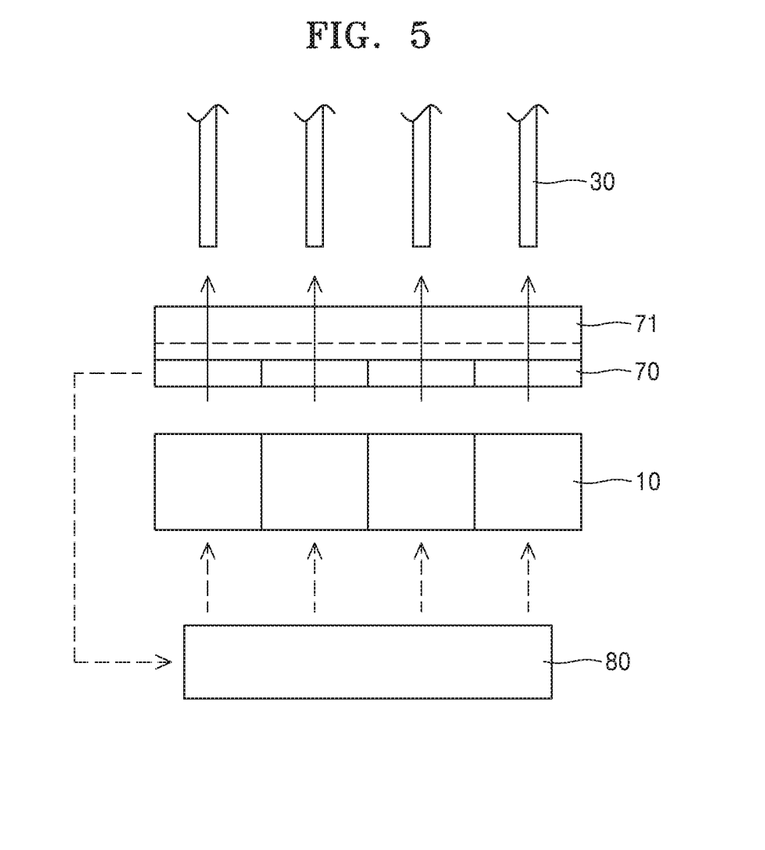
Figure 6:
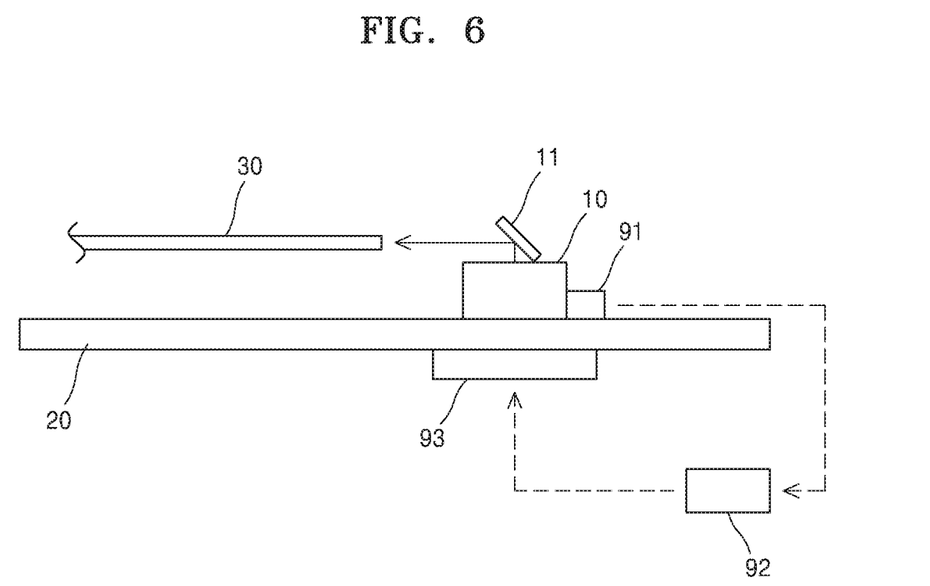

FIGS. 4 to 6 are views illustrating optical communication modules according to comparative examples for comparison with embodiments. The comparative example illustrated in FIG. 4 may include a feedback structure to compensate for optical power loss according to variations in the optical power output of an optical device 10 with respect to ambient temperature. For example, the feedback structure may be configured to detect optical power from a portion of the output of the optical device 10 and control injection current according to the detected optical power to maintain optical power at a constant level regardless of ambient temperature. To this end, an optical communication module may include: a partially reflective plate 71 configured to transmit most of the output of the optical device 10 and reflect a portion of the output of the optical device 10 to a detection device 70 (for example, a photodiode); and a driving integrated circuit (IC) 80 configured to control injection current to the optical device 10 by feeding back optical power measured by the detection device 70.

The optical communication module of the comparative example may have a complex structure because the partially reflective plate 71 for changing an optical path starting from the optical device 10 and the detection device 70 for detecting optical power are added to the optical communication module. For example, the partially reflective plate 71 for changing the optical path starting from the optical device 10 or the detection device 70 for detecting optical power on the optical path extending via the partially reflective plate 71 may be required to be precisely aligned at a position adjacent to the optical device 10, for example, along the optical path of the optical device 10, and thus precise alignment and strict process control may be required therefor.

As shown in FIG. 5, in the comparative example in which a plurality of optical devices 10 are arranged to form an array, a partially reflective plate 71 and a detection device 70 may be required for each of the optical devices 10, complicating the structure of an optical communication module. In the case in which a partially reflective plate 71 and a detection device 70 are provided to only one of the optical devices 10, a special structure may be required to provide the partially reflective plate 71 and the detection device 70 selectively to one of the optical devices 10.

The comparative example shown in FIG. 6 may include a feedback structure to maintain the temperature of an optical device 10 at an appropriate level. In the comparative example, the temperature of the optical device 10 may be maintained at a target value by measuring the temperature of the optical device 10 in real time and providing an amount of heat corresponding to the difference between the measured temperature and the target temperature. However, in this feedback structure, a separate temperature measuring unit such as a thermistor 91 may be required to measure the temperature of the optical device 10, and a driving IC 92 may be required to amplify/process a signal corresponding to the difference between a measured temperature and a target temperature to output a driving signal to a heating device 93 for providing a proper amount of heat. Therefore, the structure of an optical communication module may be complicated.

According to embodiments of the present disclosure, the operation of the temperature compensation element 50 is started by the mechanical switch 51 configured to turn on and off according to ambient temperature, and the temperature compensation element 50 provides a constant amount of heat to the optical device 10 while the operation of the temperature compensation element 50 is initiated/stopped. Therefore, a temperature measuring unit such as the thermistor 91 is not required to measure the temperature of the optical device 10 in real time, and the driving IC 92 is not required to provide a driving signal by amplifying/processing a signal corresponding to the difference between a measured temperature of the optical device 10 and a target temperature.

Figure 7:
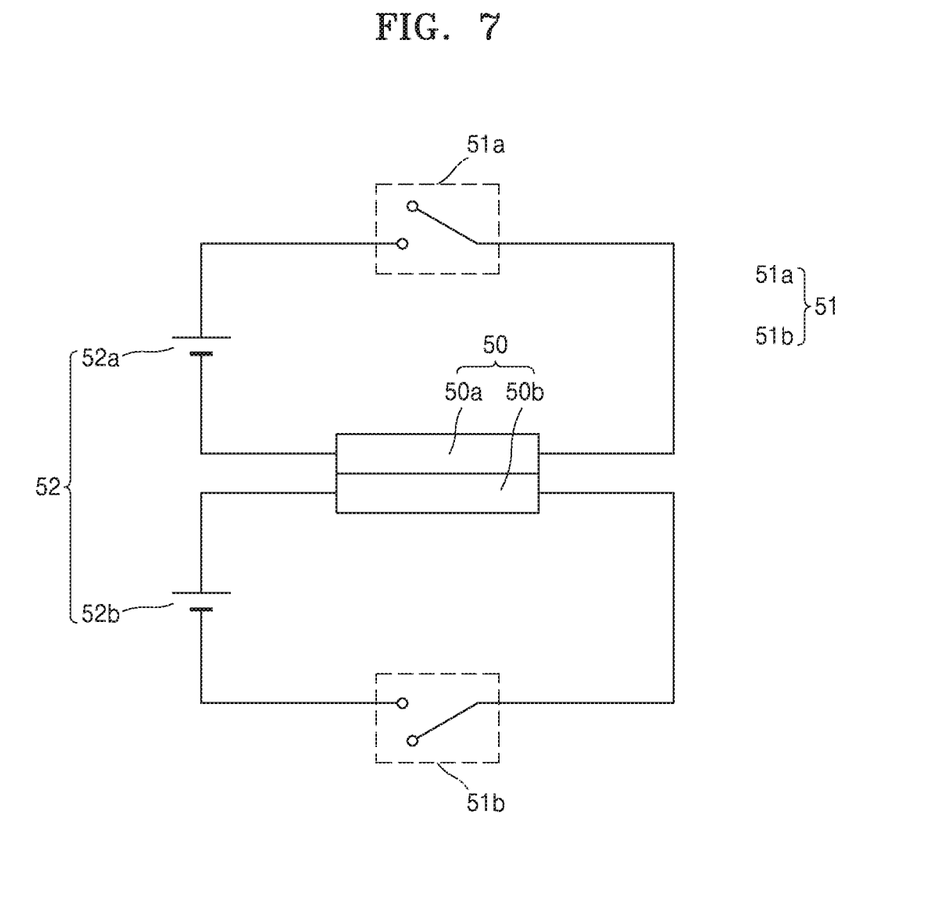
FIGS. 7 and 8 are views schematically illustrating connection between the temperature compensation element and a mechanical switch of the communication module according to embodiments.
Figure 8:
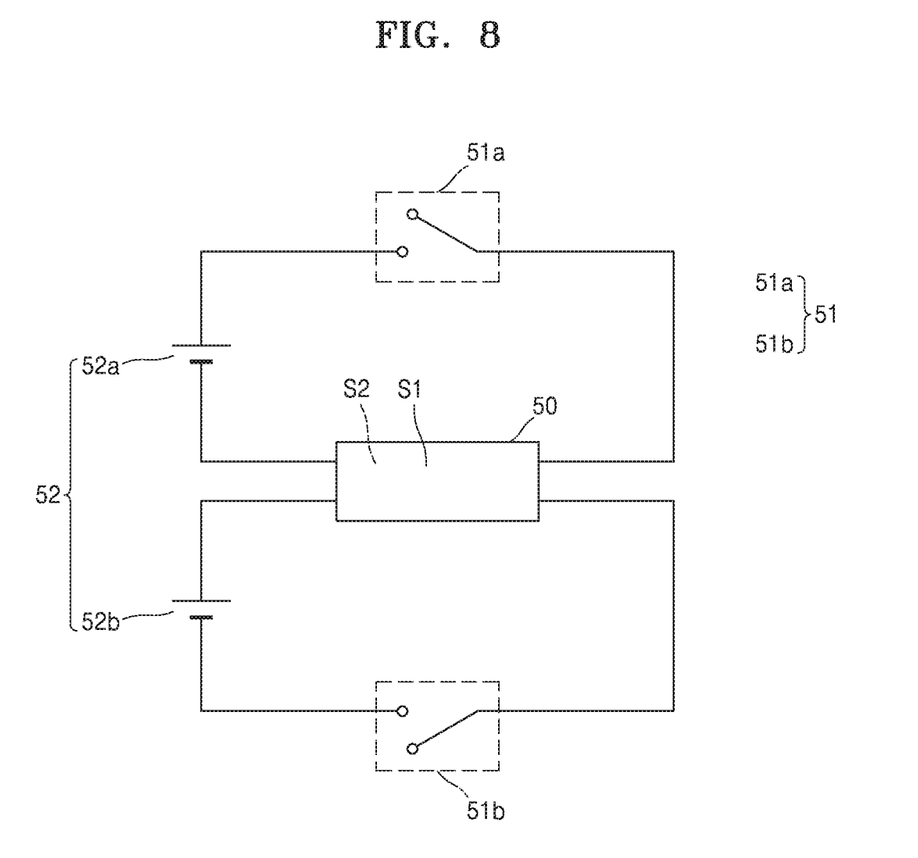

FIGS. 7 and 8 are views schematically illustrating connection between the temperature compensation element 50 and the mechanical switch 51 in the optical communication module according to embodiments.

Referring to FIGS. 7 and 8, the temperature compensation element 50 may include a heating element 50a for heating and a heat absorbing element 50b for cooling. The heating element 50a and the heat absorbing element 50b may be respectively connected to a heating switch 51a and a cooling switch 51b, and may be powered or not powered according to the on-off states of the heating switch 51a and the cooling switch 51b. A power source 52 connected to the heating element 50a and the heat absorbing element 50b through the heating switch 51a and the cooling switch 51b may include a heating power source 52a for supplying power to the heating element 50a and a cooling power source 52b for supplying power to the heat absorbing element 50b. Each of the heating switch 51a and the cooling switch 51b may correspond to the mechanical switch 51 that does not require driving power for on-off switching and may include, for example, a bi-metal.

For example, the heating switch 51a may turn on when ambient temperature reaches 0° C. The cooling switch 51b may turn on when ambient temperature reaches 60° C. The heating element 50a may provide a constant amount of heat to an optical device 10 when the heating switch 51a turns on, and the heat absorbing element 50b may remove a constant amount heat from the optical device 10 when the cooling switch 51b turns on. Here, the constant amount of heat may refer to a preset amount of heat for increasing or decreasing the temperature of the optical device 10 by a predetermined temperature difference.

In the structure shown in FIG. 7, the heating element 50a and the heat absorbing element 50b of the temperature compensation element 50 are separately provided, and in the structure shown in FIG. 8, the heating element 50a and the heat absorbing element 50b of the temperature compensation element 50 are provided as one thermoelectric element 50 (temperature compensation element). For example, the thermoelectric element 50 (temperature compensation element) may include a first surface S1 facing the optical device 10 and a second surface S2 opposite the first surface S1, wherein one of the first and second surfaces S1 and S2 may function as a heating surface which has a relatively high temperature, and the other of the first and second surfaces S1 and S2 may function as a heat absorbing surface which has a relatively low temperature.

For example, in the thermoelectric element 50 (temperature compensation element), the first surface S1 facing the optical device 10 may function as a high-temperature heating surface and the second surface S2 which is opposite the first surface S1 may function as a low-temperature heat absorbing surface according to the direction of driving current, and when the direction of driving current is reversed, the first surface S1 facing the optical device 10 may function as a low-temperature heat absorbing surface and the second surface S2 which is opposite the first surface S1 may function as a high-temperature heating surface.

For example, the heating switch 51a may be connected to the thermoelectric element 50 and may supply or interrupt power while turning on and off such that the first surface S1 of the thermoelectric element 50 may function as a high-temperature heating surface, and the cooling switch 51b may be connected to the thermoelectric element 50 and may supply or interrupt power while turning on and off such that the first surface S1 of the thermoelectric element 50 may function as a low-temperature heat absorbing surface. In this case, the heating switch 51a and the cooling switch 51b may supply driving current to the thermoelectric element 50 in opposite directions such that the first surface S1 of the thermoelectric element 50 facing the optical device 10 may selectively function as a high-temperature heating surface or a low-temperature heat absorbing surface.

As described above, according to the one or more of the above embodiments, the thermoelectric element 50 is used to heat or cool the optical device 10 according to the surrounding low-temperature or high-temperature environment, thereby making it possible to maintain proper modulation performance over a widened temperature range when an electrical signal is converted into an optical signal and to maintain the optical power of the optical device 10 at a proper level.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:
1. An optical communication module comprising:
an optical device configured to provide an optical output from an electrical input;
a circuit board on which the optical device is mounted and which is configured to provide the electrical input to the optical device;

a temperature compensation element mounted on a side of the circuit board; and
a mechanical switch connected to the temperature compensation element and configured to turn on/off according to ambient temperature for supplying or interrupting power to the temperature compensation element,
wherein the temperature compensation element comprises:
a heating element configured to generate heat at a low temperature; and
a heat absorbing element configured to absorb heat at a high temperature,
wherein the mechanical switch comprises:
a heating switch connected to the heating element and configured to supply or interrupt power to the heating element while turning on/off according to ambient temperature; and
a cooling switch connected to the heat absorbing element and configured to supply or interrupt power to the heat absorbing element while turning on/off according to ambient temperature.

2. The optical communication module of claim 1, wherein the mechanical switch does not require a power source to operate the mechanical switch itself, wherein the mechanical switch is configured to turn on and off without the driving power source.

3. The optical communication module of claim 1, wherein the mechanical switch comprises a bi-metal comprising different types of metal plates which are bonded together and have different thermal expansion coefficients.

4. The optical communication module of claim 1, wherein the optical device and the temperature compensation element are mounted on opposite surfaces of the circuit board.

5. The optical communication module of claim 4, wherein the optical device and the temperature compensation element are arranged such that at least portions of the optical device and the temperature compensation element overlap each other.

6. The optical communication module of claim 1, wherein the temperature compensation element comprises a heating element for heating, and
when the optical device has a temperature range of $\Delta T1$ as a properly operable range ranging from a first temperature to a second temperature,
the mechanical switch is configured to turn on at the first temperature or lower, and
the temperature compensation element is configured to increase a temperature of the optical device to a value different from ambient temperature by a temperature difference $\Delta T2$ which is less than the $\Delta T1$.

7. The optical communication module of claim 6, wherein when the optical device has a temperature range of about 0° C. to about 60° C. as the properly operable range,
the mechanical switch is configured to turn on at about 0° C. or lower, and
the temperature compensation element is configured to increase the temperature of the optical device to a value different from ambient temperature by about 50° C.

8. The optical communication module of claim 6, wherein the $\Delta T1$ is about 60° C., and the $\Delta T2$ is about 50° C.

9. The optical communication module of claim 1, wherein the temperature compensation element comprises a heat absorbing element for cooling, and
when the optical device has a temperature range of $\Delta T1$ as a properly operable range ranging from a first temperature to a second temperature,
the mechanical switch is configured to turn on at the second temperature or higher, and
the temperature compensation element is configured to decrease a temperature of the optical device to a value different from ambient temperature by a temperature difference $\Delta T2$ which is less than the $\Delta T1$.

10. The optical communication module of claim 9, wherein
when the optical device has a temperature range of about 0° C. to about 60° C. as the properly operable range,
the mechanical switch is configured to turn on at about 60° C. or higher, and
the temperature compensation element is configured to decrease the temperature of the optical device to a value different from ambient temperature by about 50° C.

11. The optical communication module of claim 9, wherein the $\Delta T1$ is about 60° C., and the $\Delta T2$ is about 50° C.

12. The optical communication module of claim 1, wherein the temperature compensation element comprises a thermoelectric element comprising a first surface facing the optical device and a second surface opposite the first surface, one of the first and second surfaces functioning as a heating surface having a relatively high temperature, the other of the first and second surfaces functioning as a heat absorbing surface having a relatively low temperature,
wherein the mechanical switch comprises:
a heating switch connected to the thermoelectric element and configured to supply or interrupt power while turning on/off such that the first surface of the thermoelectric element functions as the heating surface; and
a cooling switch connected to the thermoelectric element and configured to supply or interrupt power while turning on/off such that the first surface of the thermoelectric element functions as the heat absorbing surface.

13. The optical communication module of claim 12, wherein the heating switch and the cooling switch are configured to supply driving current to the thermoelectric element in opposite directions.

14. The optical communication module of claim 1, wherein the optical device, the circuit board, the temperature compensation element, and the mechanical switch are accommodated in a module housing.

15. The optical communication module of claim 1, wherein a stationary air layer contained in a module housing is between the optical device and the mechanical switch.

16. The optical communication module of claim 1, wherein a resin molding surrounding the optical device is between the optical device and the mechanical switch.

* * * * *